(12) United States Patent  
Yeo et al.

(10) Patent No.: US 8,106,402 B2
(45) Date of Patent: Jan. 31, 2012

(54) FLAT PANEL DISPLAY APPARATUS AND METHOD OF MANUFACTURING THE SAME

(75) Inventors: Jong-Mo Yeo, Yongin (KR); Dae-Hyun No, Yongin (KR); Do-Hyun Kwon, Yongin (KR); Choong-Youl Im, Yongin (KR); Soo-Beom Jo, Yongin (KR); Sung-Won Doh, Yongin (KR); Il-Jeong Lee, Yongin (KR); Cheol-Ho Yu, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 126 days.

(21) Appl. No.: 12/647,055

(22) Filed: Dec. 24, 2009

(65) Prior Publication Data

US 2010/0193790 A1 Aug. 5, 2010

(30) Foreign Application Priority Data

Jan. 30, 2009 (KR) ........................ 10-2009-0007385

(51) Int. Cl.
*H01L 33/00* (2010.01)
*H01L 21/28* (2006.01)

(52) U.S. Cl. ............... 257/72; 257/59; 257/66; 257/68; 257/E33.053; 257/E21.158; 438/29; 438/34

(58) Field of Classification Search .............. 257/50–72, 257/E21.158, E33.053
See application file for complete search history.

(56) References Cited

U.S. PATENT DOCUMENTS

| 7,256,061 B2 | 8/2007 | Yang | |
|---|---|---|---|
| 7,435,992 B2 | 10/2008 | Choi et al. | |
| 7,701,521 B2 | 4/2010 | Yang | |
| 2005/0040753 A1* | 2/2005 | Osame et al. | 313/500 |
| 2008/0246027 A1* | 10/2008 | Kim | 257/40 |
| 2009/0009094 A1* | 1/2009 | Choi et al. | 315/169.3 |
| 2009/0278131 A1* | 11/2009 | Kwon et al. | 257/72 |

FOREIGN PATENT DOCUMENTS

| KR | 10-2003-0069668 | 8/2003 |
|---|---|---|
| KR | 10-2004-0037889 | 5/2004 |
| KR | 10-2006-0012373 | 2/2006 |
| KR | 10-0579182 | 5/2006 |
| KR | 10-0892945 | 4/2009 |

OTHER PUBLICATIONS

Korean Office Action dated Sep. 27, 2010, issue in corresponding Korean Patent Application No. 10-2009-0007385.

* cited by examiner

*Primary Examiner* — N Drew Richards
*Assistant Examiner* — Mamadou Diallo
(74) *Attorney, Agent, or Firm* — Robert E. Bushnell, Esq.

(57) ABSTRACT

A flat panel display apparatus that can be manufactured with less patterning operations using a mask, and a method of manufacturing the same, the flat panel display apparatus including a substrate; an active layer of a thin film transistor (TFT); a first bottom electrode and a first top electrode of a capacitor; a first insulation layer formed on the substrate; a gate bottom electrode and a gate top electrode corresponding to the channel region; a second bottom electrode and a second top electrode of the capacitor; a pixel bottom electrode and a pixel top electrode; a second insulation layer formed on the gate electrode, the second electrode of the capacitor, and the pixel top electrode; and a source electrode and a drain electrode formed on the second insulation layer.

26 Claims, 9 Drawing Sheets

FLAT PANEL DISPLAY APPARATUS AND METHOD OF MANUFACTURING THE SAME

CROSS-REFERENCE TO RELATED APPLICATION

This application claims the benefit of Korean Application No. 10-2009-0007385, filed Jan. 30, 2009, in the Korean Intellectual Property Office, the disclosure of which is incorporated herein by reference.

BACKGROUND OF THE INVENTION

1. Field of the Invention

Aspects of the present invention relate to a flat panel display apparatus and a method of manufacturing the same, and more particularly, to a flat panel display apparatus having increased display quality and that can be manufactured simply, and a method of manufacturing the same.

2. Description of the Related Art

Flat panel display apparatuses, such as organic light emitting diode (OLED) apparatuses, liquid crystal display (LCD) apparatuses, and other similar display apparatuses, are fabricated on a substrate on which a pattern including a thin film transistor (TFT), a capacitor, and wiring connecting the TFT and the capacitor is formed.

Generally, a fine structure pattern including a TFT, a capacitor or other similar elements, is transferred to an array substrate by using a mask on which the fine structure pattern is printed so that a substrate on which a flat panel display apparatus is fabricated can be patterned.

Pattern transfer is generally performed by using a photolithography method. According to the photolithography method, photoresist is evenly applied on a substrate on which a pattern is to be formed. The photoresist is exposed to light by using photolithography equipment such as a stepper, and the sensitized photoresist is developed (in the case of positive photoresist). Furthermore, after the photoresist is developed, the remaining photoresist is used as a mask for etching a pattern, and the unused photoresist is removed.

In the process of transferring a pattern by using the mask as described above, it is necessary to prepare the mask having a required pattern, and thus costs for fabricating the mask increase as more operations are performed using the mask. Furthermore, complex operations described above are required to transfer a pattern by using the mask. Thus, the overall fabricating process becomes complicated, and time and cost required for a fabrication operation increase.

SUMMARY OF THE INVENTION

Aspects of the present invention provide a flat panel display apparatus having excellent display quality and that can be manufactured with less patterning operations using a mask, and a method of manufacturing the same.

According to an aspect of the present invention, there is provided a flat panel display apparatus including a substrate; an active layer of a thin film transistor (TFT), including a channel region, a source region, and a drain region wherein the channel region, the source region and the drain region are formed on the same layer on the substrate; a first bottom electrode of a capacitor formed apart from the active layer on the same layer of the substrate as the active layer and formed of a same material as the active layer and a first top electrode of a capacitor formed on the first bottom electrode; a first insulation layer formed on the substrate, the active layer, and the first top electrode; a gate bottom electrode and a gate top electrode sequentially formed on a portion of the first insulation layer corresponding to the channel region; a second bottom electrode and a second top electrode of the capacitor formed of the same material used to form the gate bottom electrode and the gate top electrode, wherein the second bottom electrode and the second top electrode are sequentially formed on a portion of the first insulation layer corresponding to the first top electrode of the capacitor; a pixel bottom electrode formed of the same material used to form the gate bottom electrode and the second bottom electrode of the capacitor and formed on the first insulation layer, a pixel top electrode formed of the same material as that used to form the gate top electrode and the second top electrode of the capacitor and formed on the edge of the top surface of the pixel bottom electrode to expose the pixel bottom electrode; a second insulation layer formed on the gate electrode, the second electrode of the capacitor, and the pixel top electrode and penetrated by a contact hole exposing the source region and the drain region of the active layer and a via hole partially exposing the edges of the pixel top electrode; and a source electrode and a drain electrode formed on the second insulation layer and connected to the source region, the drain region, and the pixel top electrode via the contact hole and the via hole.

According to another aspect of the present invention, there is provided a flat panel display apparatus including a substrate; an active layer of a thin film transistor (TFT), including a channel region formed on the substrate, a source region and a drain region, wherein the channel region, the source region and the drain region are formed on the edge of the top surface of the channel region; a first bottom electrode of a capacitor formed apart from the active layer on the same layer as the channel region and formed of a same material as the active layer, a first top electrode of a capacitor formed on the first bottom electrode; a first insulation layer formed on the substrate, the active layer, and the first top electrode; a gate bottom electrode and a gate top electrode sequentially formed on a portion of the first insulation layer corresponding to the channel region; a second bottom electrode and a second top electrode of the capacitor formed of the same material used to form the gate bottom electrode and the gate top electrode and sequentially formed on a portion of the first insulation layer corresponding to the first top electrode of the capacitor; a pixel bottom electrode formed of the same material used to form the gate bottom electrode and the second bottom electrode of the capacitor and formed on the first insulation layer, a pixel top electrode formed of the same material used to form the gate top electrode and the second top electrode of the capacitor and formed on the edge of the top surface of the pixel bottom electrode to expose the pixel bottom electrode; a second insulation layer formed on the gate electrode, the second electrode of the capacitor, and the pixel top electrode and penetrated by a contact hole exposing the source region and the drain region of the active layer and a via hole partially exposing the edges of the pixel top electrode; and a source electrode and a drain electrode formed on the second insulation layer and connected to the source region, the drain region, and the pixel top electrode via the contact hole and the via hole.

According to another aspect of the present invention, there is provided a method of manufacturing a flat panel display apparatus, the method including sequentially forming a semiconductor layer and a first conductive layer on a substrate; simultaneously patterning the semiconductor layer and the first conductive layer to form an active layer of a thin-film transistor (TFT) and a capacitor having a first bottom electrode and a first top electrode in a first masking operation;

forming a first insulation layer on a structure formed by the first masking operation; sequentially forming a second conductive layer and a third conductive layer on the first insulation layer; simultaneously patterning each of the second conductive layer and the third conductive layer to respectively form a gate bottom electrode and a gate top electrode of the TFT, to form a second bottom electrode and a second top electrode of the capacitor, and to form a pixel bottom electrode and a pixel top electrode in a second masking operation; forming a source region and a drain region in edges of the active layer of the TFT by using the gate bottom electrode and the gate top electrode as a self-aligned mask; forming a second insulation layer on a structure formed by the second masking operation; patterning the second insulation layer to partially expose the source region and the drain region and edges of the pixel top electrode in a third masking operation; forming a fourth conductive layer on a structure formed by the third masking operation; patterning the fourth conductive layer to form a source electrode and a drain electrode of the TFT in a fourth masking operation; forming a third insulation layer on a structure formed by the fourth masking operation; and removing the second insulation layer and the third insulation layer such that the pixel top electrode is exposed, in a fifth masking operation.

According to another aspect of the present invention, there is provided a method of manufacturing a flat panel display apparatus, the method including forming a semiconductor layer and a first conductive layer on a substrate; simultaneously patterning the semiconductor layer and the first conductive layer to form an active layer of a thin-film transistor (TFT) in a first masking operation, wherein the active layer includes a channel region, a source region, and a drain region, and a capacitor having a first bottom electrode and a first top electrode; forming a first insulation layer on a structure formed by the first mask operation; sequentially forming a second conductive layer and a third conductive layer on the first insulation layer; simultaneously patterning each of the second conductive layer and the third conductive layer respectively to form a gate bottom electrode and a gate top electrode of the TFT, to form a second bottom electrode and a second top electrode of the capacitor, and to form a pixel bottom electrode and a pixel top electrode in a second mask operation; forming a second insulation layer on a structure formed by the second masking operation; patterning the second insulation layer to partially expose the source region and the drain region and edges of the pixel top electrode in a third masking operation; forming a fourth conductive layer on a structure formed by the third masking operation; patterning the fourth conductive layer to form a source electrode and a drain electrode of the TFT in a fourth masking operation; forming a third insulation layer on a structure formed by the fourth masking operation; and removing the second insulation layer and the third insulation layer such that the pixel top electrode is exposed, in a fifth masking operation.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

As referred to herein, when a first element is said to be disposed or formed "on" a second element, the first element can directly contact the second element, or can be separated from the second element by one or more other elements located therebetween. In contrast, when an element is referred to as being disposed or formed "directly on" another element, there are no intervening elements present.

First, referring to FIGS. 1 through 16, a flat panel display apparatus according to an embodiment of the present invention will be described.

Figure 15:
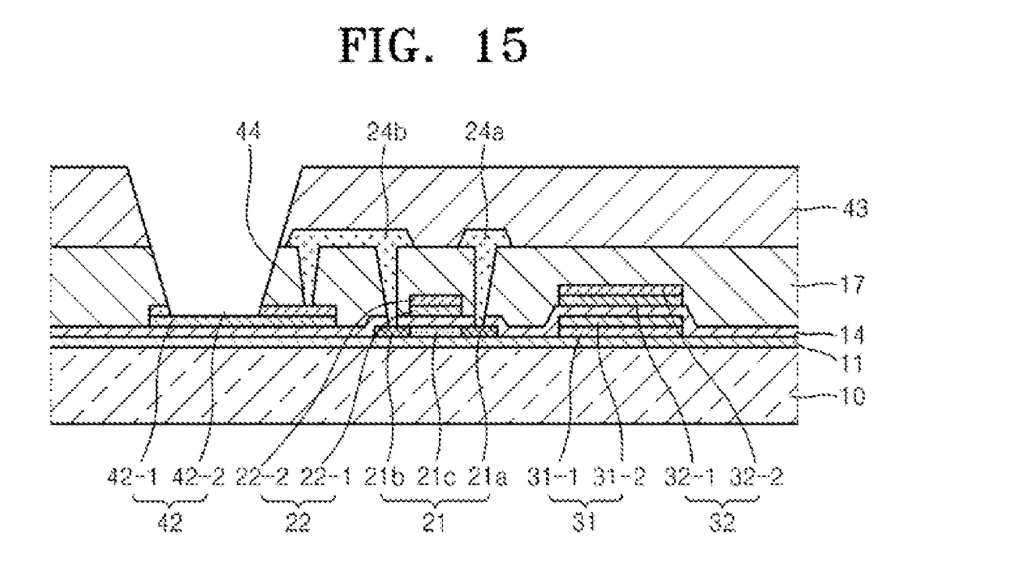
Figure 16:
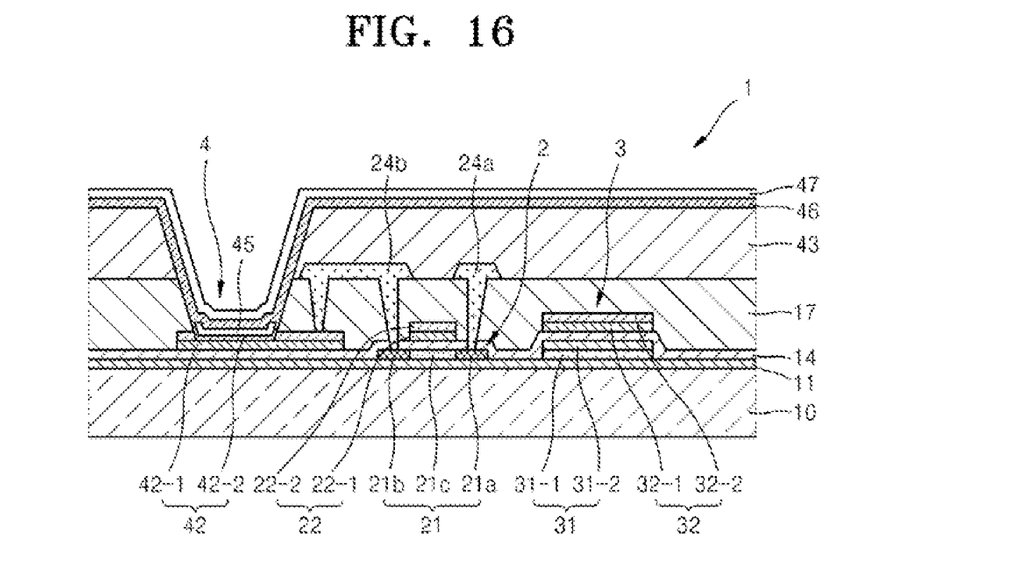
FIG. 16 is a sectional view showing a flat panel display apparatus according to an embodiment of the present invention.

FIGS. 1 through 15 are sectional views roughly showing a method of manufacturing an organic light emitting diode (OLED) display apparatus, according to an embodiment of the present invention, and FIG. 16 is a sectional view roughly showing an OLED display apparatus 1 fabricated using the method illustrated in FIGS. 1 through 15, according to an embodiment of the present invention.

Referring to FIG. 16, the OLED display apparatus 1 according to the current embodiment includes a substrate 10, a buffer layer 11, a thin-film transistor (TFT) 2, a capacitor 3, and an OLED 4.

Figure 1:
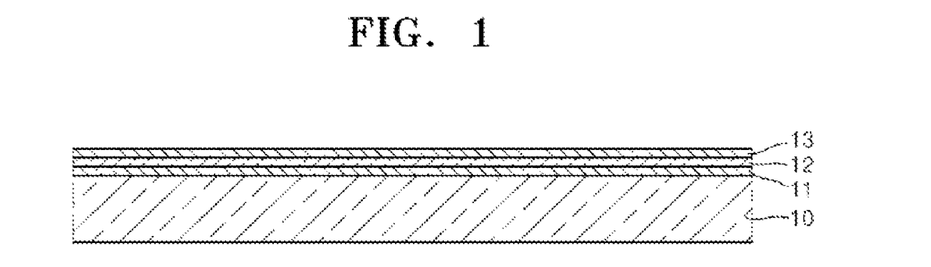
FIGS. 1 through 5 are sectional views showing a first masking operation of a method of manufacturing a flat panel display apparatus, according to an embodiment of the present invention.

First, referring to FIG. 1, the buffer layer 11, a semiconductor layer 12, and a first conductive layer 13 are sequentially formed on the substrate 10.

The substrate 10 may be formed of a transparent glass material primarily composed of SiO2. However, aspects of the present invention are not limited thereto, and the substrate 10 may be formed of an opaque glass material, plastics, or other such materials. However, if the OLED display apparatus 1 is a bottom emission type OLED display apparatus in which images of the OLED display apparatus 1 are viewed below the substrate 10, the substrate 10 should be formed of a transparent material.

The buffer layer 11 may be disposed on the top surface of the substrate 10 to smooth the substrate 10 and to preventing impurities from penetrating into the substrate 10. The buffer layer 11 may be formed of SiO2 and/or SiNx, and may be deposited by using a deposition method such as plasma enhanced chemical vapor deposition (PECVD), atmospheric pressure CVD (APCVD), low pressure CVD (LPCVD), or other similar deposition methods.

The semiconductor layer 12 may be formed of poly-crystal silicon crystallized after depositing amorphous silicon. The amorphous silicon may be crystallized by rapid thermal annealing (RTA), solid phase crystallization (SPC), excimer laser annealing (ELA), metal induced crystallization (MIC), metal induced lateral crystallization (MILC), sequential lateral solidification (SLS), or the like.

The first conductive layer 13 is formed on the semiconductor layer 12. According to the present embodiment, the first conductive layer 13 is formed by depositing amorphous silicon containing n-type or p-type impurities and performing a heat treatment process on the amorphous silicon. However, aspects of the present invention are not limited thereto, and the first conductive layer 13 may include any material containing a metal.

Figure 2:
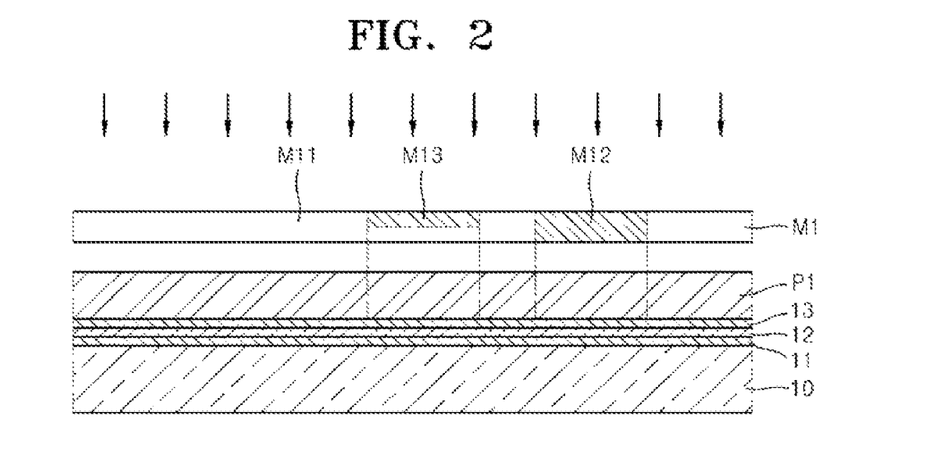

Referring to FIG. 2, photoresist is applied to the top surface of the structure shown in FIG. 1, and a first photoresist layer P1 is formed by either pre-baking or soft-baking the photoresist. Next, a first mask M1 on which a predetermined pattern is printed is prepared and aligned on the substrate 10 for patterning the first photoresist layer P1.

The first mask M1 is a half-tone mask including a photo-transmissive region M11, a photo-interceptive region M12, and a semi photo-transmissive region M13. The photo-transmissive region M11 transmits light of wavelengths in a predetermined range. The photo-interceptive region M12 blocks irradiated light. The semi photo-transmissive region M13 transmits only some of the irradiated light.

FIG. 2 is a concept view describing concepts of each of the regions of the first mask M1. The first mask M1 may be formed as a predetermined pattern on a transparent substrate, such as a quartz (Qz) substrate. Here, the photo-interceptive region M12 is formed by patterning materials such as Cr or CrO2 on the quartz substrate, and the semi photo-transmissive region M13 may be formed of at least one of Cr, Si, Mo, Ta, and Al. Photo-transmissivity of the semi photo-transmissive region M13 may be controlled by changing composition ratio and/or thickness of materials forming the semi photo-transmissive region M13.

The first mask M1 on which a pattern as described above is printed is aligned on the substrate 10, and a photolithographic operation is performed by irradiating light of wavelengths in a predetermined range onto the first photoresist layer P1.

Figure 3:
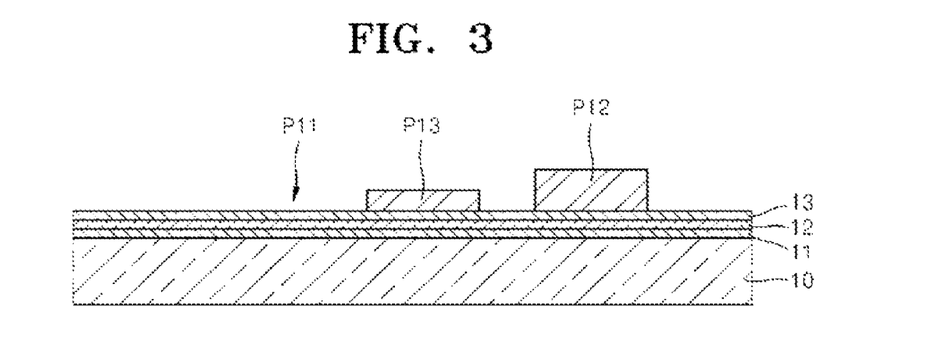

FIG. 3 shows a pattern of the first photoresist layer P1 remaining after removing exposed portions of the first photoresist layer P1. Although positive photoresist, of which exposed portions are removed, is used in the current embodiment, aspects of the present invention are not limited thereto, and negative photoresist can also be used.

Referring to FIG. 3, a portion P11 of the photoresist layer P1 corresponding to the photo-transmissive region M11 of the first mask M1 is removed, whereas a portion P12 of the first photoresist layer P1 corresponding to the photo-interceptive region M12 and a portion P13 of the first photoresist layer P1 corresponding to the semi photo-transmissive region M13 remain. At this point, the thickness of the portion P13 of the first photoresist layer P1 corresponding to the semi photo-transmissive region M13 is less than that of the portion P12 of the first photoresist layer P1 corresponding to the photo-interceptive region M12, and the thickness of the portion P13 may be controlled by changing the composition ratio and/or thickness of materials forming the semi photo-transmissive region M13.

The semiconductor layer 12 and the first conductive layer 13 on the substrate 10 are etched using etching equipment, wherein the portions P12 and P13 of the first photoresist layer P1 are used as etching masks. In this regard, the region P11 is etched first, and the thickness of the region P13 of the first photoresist layer P1 is reduced by etching. Here, the etching operation may comprise wet etching, dry etching, or the like, however, aspects of the present invention are not limited thereto.

Figure 4:
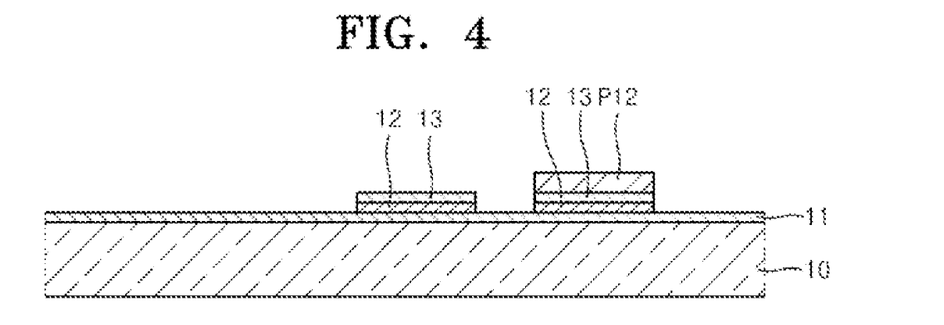

Referring to FIG. 4, while a first etching operation is being performed, portions of the semiconductor layer 12 and the first conductive layer 13 of FIG. 3 corresponding to the portion P11 of the first photoresist layer P1 are etched. Furthermore, although the portion P13 of the photoresist layer P13 corresponding to the semi photo-transmissive region M13 of FIG. 3 is etched, structures below the portion P13 of the photoresist layer P13 remain. Meanwhile, the portion P12 of the first photoresist layer P1 corresponding to the photo-interceptive region M12 partially remains after the first etching operation, and a second etching operation is performed by using the remainder of the portion P12 of the first photoresist layer P1 as an etching mask.

Figure 5:
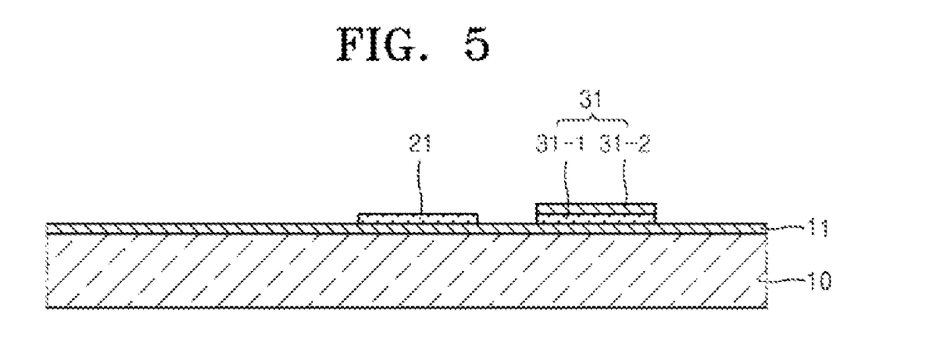

Referring to FIG. 5, the remainder of the portion P12 of the photoresist layer P1, which remained after the first etching operation, and the first conductive layer 13 in the region corresponding to the semi photo-transmissive region M13, are completely etched in the second etching operation. As a result, a first electrode 31 and an active layer 21 are formed on the buffer layer 11, wherein the first electrode 31 includes a first bottom electrode 31-1 including a portion of the semiconductor layer 12 and a first top electrode 31-2 including a portion of the first conductive layer 13, and the active layer 21 includes a portion of the semiconductor layer 12. The first bottom electrode 31-1 and the first top electrode 31-2 constitute a capacitor, and the active layer 21 is part of a TFT.

The active layer 21 of the TFT and the first bottom electrode 31-1 and the first top electrode 31-2 of the capacitor are simultaneously patterned on a same structure by using the same mask M1, and thus the active layer 21 of the TFT and the first bottom electrode 31-1 of the capacitor are formed of the same material and are formed on the same layer. Furthermore, since they are simultaneously patterned by using the same mask M1, shapes of ends of the capacitor formed by the first bottom electrode 31-1 and the first top electrode 31-2 are the same.

Figure 6:
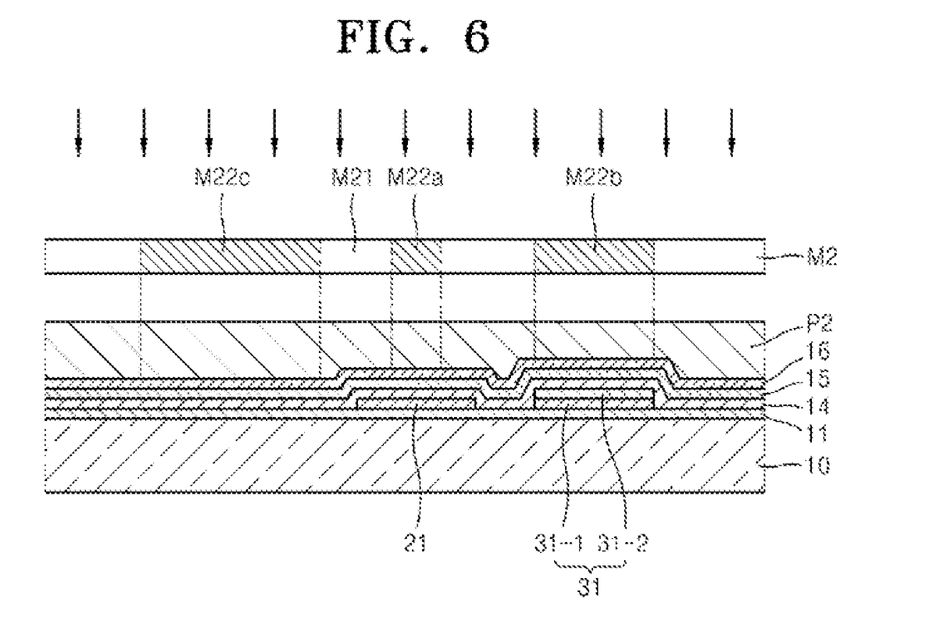
FIGS. 6 through 9 are sectional views showing a second masking operation of the method of manufacturing a flat panel display apparatus, according to an embodiment of the present invention.

Referring to FIG. 6, a first insulation layer 14, a second conductive layer 15, and a third conductive layer 16 are sequentially formed on the structure of FIG. 5, which is the result of the first masking operation. A second photoresist layer P2 is formed on the third conductive layer 16, and a second mask M2 is aligned on the substrate 10.

The first insulation layer 14 may be formed by depositing an inorganic insulation material using a deposition method such as PECVD, APCVD, LPCVD, or the like, wherein the inorganic insulation material comprises a material such as SiNx or SiOx. A portion of the first insulation layer 14 is interposed between the active layer 21 and a gate bottom electrode 22-1 of a TFT 2 (to be described later) and functions as a gate insulation layer of the TFT 2, whereas another portion of the first insulation layer 14 is interposed between the first top electrode 31-2 and a second bottom electrode 32-1 of a capacitor 3 (to be described later) and functions as a first dielectric layer.

Figure 8:
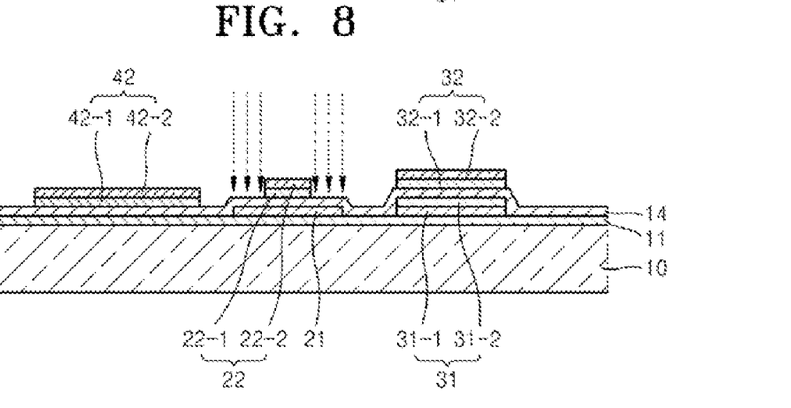

The second conductive layer 15 may contain one or more transparent materials such as ITO, IZO, ZnO, and In2O3. As shown in FIG. 8, the second conductive layer 15 constitutes a pixel bottom electrode 42-1 of a flat panel display, a gate bottom electrode 22-1 of the TFT 2, and the second bottom electrode 32-1 of the capacitor 3. Although the second conductive layer 15 is formed as a single layer in the current embodiment, aspects of the present invention are not limited thereto, and a plurality of conductive layers may be formed. In other words, when a pixel electrode 42 (to be described later) is only formed of transparent materials as in the current embodiment, the pixel electrode 42 can be used in a bottom-emission type display apparatus in which images are viewed from below the substrate 10. However, in the case of a top-emission type display apparatus, a reflective layer may be formed by forming the plurality of second conductive layers and depositing transparent conductive materials thereon, wherein the transparent conductive materials are as materials used in the current embodiment. Furthermore, more than two layers may be formed if required, however, aspects of the present invention are not limited thereto.

The third conductive layer 16 may contain one or more materials from among Ag, Mg, Al, Pt, Pd, Au, Ni, Nd, Ir, Cr, Li, Ca, Mo, Ti, W, MoW, and Al/Cu. The third conductive layer 16 constitutes a pixel top electrode 42-2 of a flat panel display, a gate top electrode 22-2 of the TFT 2, and a second top electrode 32-2 of the capacitor 3.

The second mask M2 includes a photo-transmissive region M21 and photo-interceptive regions M22a, M22b, and M22c in predetermined patterns. The second mask M2 is aligned on the substrate 10, and light of wavelengths in a predetermined range is irradiated onto the second photoresist layer P2.

Figure 7:
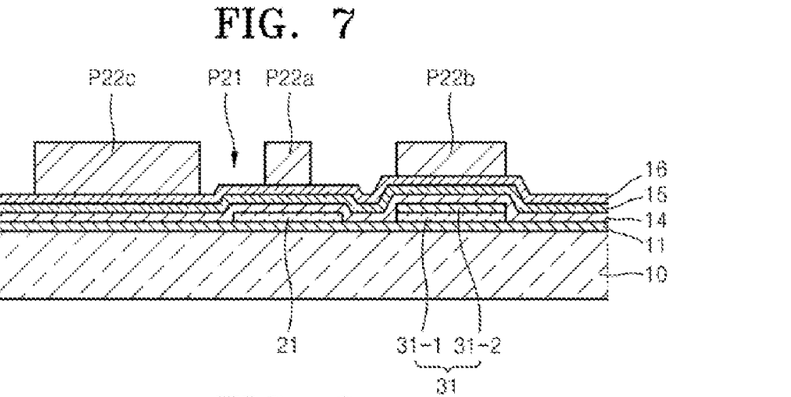

Referring to FIG. 7, a portion P21 of the second photoresist layer P2 corresponding to the photo-transmissive region M21 of the second mask M2 is removed, whereas portions P22a, P22b, and P22c of the second photoresist layer P2, which respectively correspond to the photo-interceptive regions M22a, M22b, and M22c, remain.

The portions P22a, P22b, and P22c of the second photoresist layer P2 are used as masks to etch the second conductive layer 15 and the third conductive layer 16 on the substrate 10 using etching equipment, in a second masking operation. The etching operation described above may comprise wet etching, dry etching, or the like, however, aspects of the present invention are not limited thereto.

Referring to FIG. 8, a structure obtained after the etching operation in the second masking operation, is shown. Portions of the second conductive layer 15 and the third conductive layer 16 in the region P21 of the second photoresist layer P2, which is a region from which the second photoresist layer P2 is removed, are etched. In the regions where the second photoresist layer P2 remains, a double-layered gate electrode 22 is patterned to correspond to the center region of the active layer 21 of the TFT 2. Using a pattern of the double-layered gate electrode 22, either n-type or p-type impurities are implanted into edges of the active layer 21 of the TFT 2.

Figure 9:
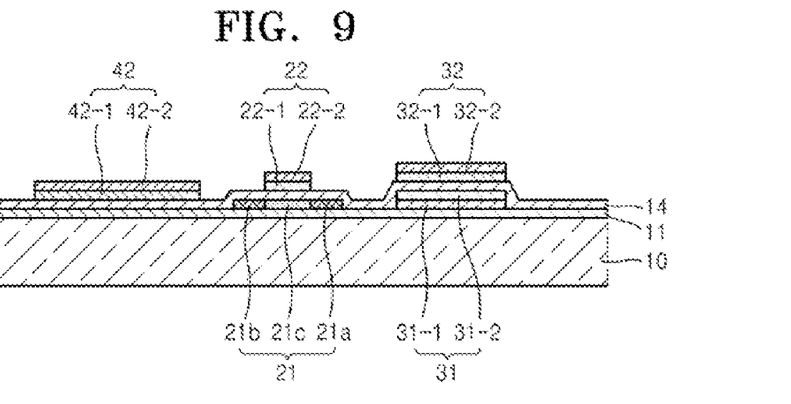

FIG. 9 shows a structure obtained after etching and ion implanting operations are performed in the second masking operation, is shown. The active layer 21 of the TFT 2 includes a source region 21a, a drain region 21b, and a channel region 21c that are formed by the ion implantation. The double-layered gate electrode 22, double-layered first and second electrodes 31 and 32 of the capacitor 3, and a double-layered pixel electrode 42 are formed at a location corresponding to the channel region 21c of the TFT 2.

Referring to FIG. 9, the double-layered pixel electrode 42, the gate electrode 21 of the TFT 2, and the second electrode 32 of the capacitor 3 are simultaneously patterned on the same structure using the same second mask M2. Thus, the pixel bottom electrode 42-1, the gate bottom electrode 21-1 of the TFT 2, and the second bottom electrode 32-1 are formed of the same material and formed on the same layer, whereas the pixel top electrode 42-2, the gate top electrode 21-2 of the TFT 2, and the second top electrode 32-2 of the capacitor 3 are formed of the same material and formed on the same layer. Furthermore, shapes of ends of each of the pixel bottom electrode 42-1 and the pixel top electrode 42-2, ends of the gate bottom electrode 22-1 and the gate top electrode 22-2, and ends of the second bottom electrode 32-1 and the second top electrode 32-2 of the capacitor 3 are the same.

Figure 10:
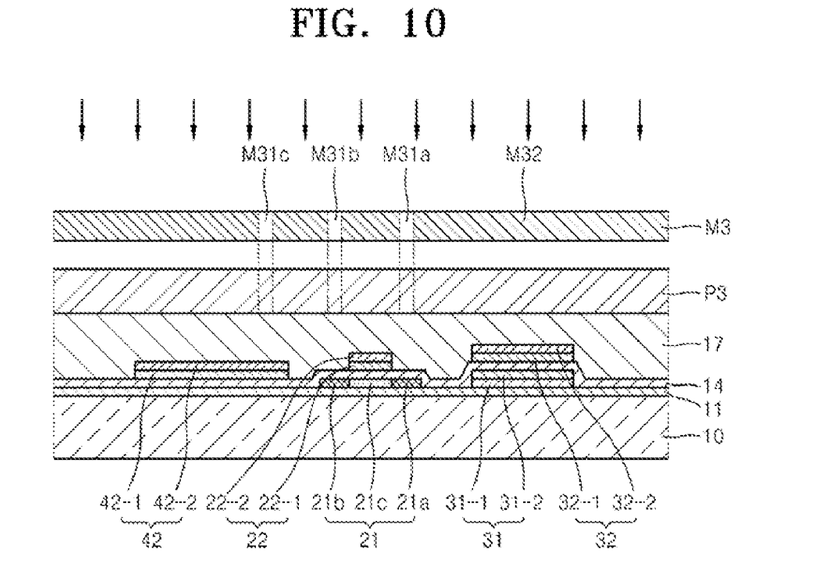
FIGS. 10 and 11 are sectional views showing a third masking operation of the method of manufacturing a flat panel display apparatus, according to an embodiment of the present invention.

Referring to FIG. 10, a second insulation layer 17 is formed on the structure shown in FIG. 9, which is a result of the second masking operation. A third photoresist layer P3 is formed on the second insulation layer 17, and a third mask M3 is aligned on the substrate 10.

The second insulation layer 17 may be formed of one or more organic insulation materials, such as polyimide, polyamide, acryl resin, and phenol resin, using a method such as spin coating. The second insulation 17 is formed to have a thickness sufficient to function as an interlayer insulation layer between the double-layered gate electrode 22 of the thin-film transistor (TFT) 2 and a source electrode 24a and a drain electrode 24b described below. Meanwhile, the second insulation layer 17 may be formed of not only organic insulation materials as described above, but also inorganic insulation materials as the first insulation layer 14 described above. Furthermore, the second insulation layer 17 may also be formed by alternating organic insulation materials and inorganic insulation materials of an alternate structure of organic insulation materials and inorganic insulation materials.

The third mask M3 is patterned to include photo-transmissive regions M31a, M31b, and M31c and a photo-interceptive region M32, corresponding to portions of the source region 21a and the drain region 21b and portions of the edges of the pixel electrode 42. The third mask M3 including the patterns described above is aligned on the substrate 10, and a photolithographic operation is performed thereon.

Figure 11:
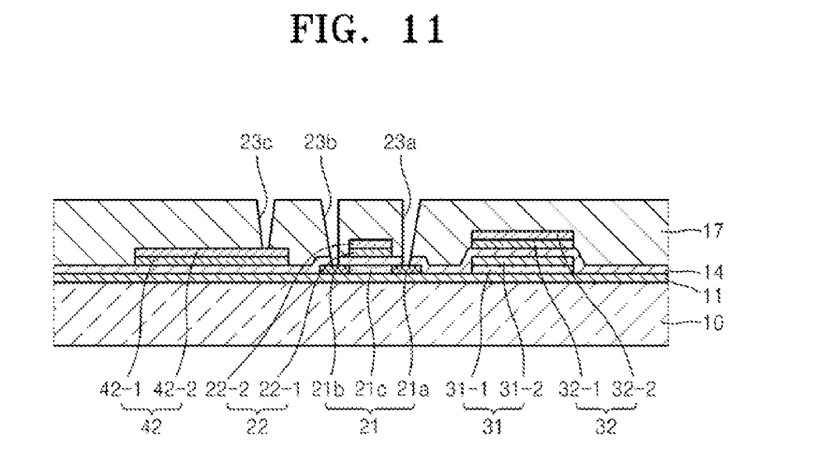

FIG. 11 illustrates the resulting structure after an etching operation using the remaining portions of the third photoresist layer P3 as etching masks is performed, wherein the remaining portions remain after exposed portions of the third photoresist layer P3 are removed. This is referred to as a third masking operation. Openings 23a, 23b, and 23c, which expose the portions of the source region 21a and the drain region 21b and a region corresponding to the portions of the edges of the pixel top electrode 42-2, are formed. From among the openings 23a, 23b, and 23c, the openings 23a and 23b formed in the portions of the source region 21a and the drain region 21b constitute contact holes, whereas the opening 23c formed in the region corresponding to the portions of the edges of the pixel top electrode 42-2 constitutes a via hole. However, aspects of the present invention are not limited to such names.

Figure 12:
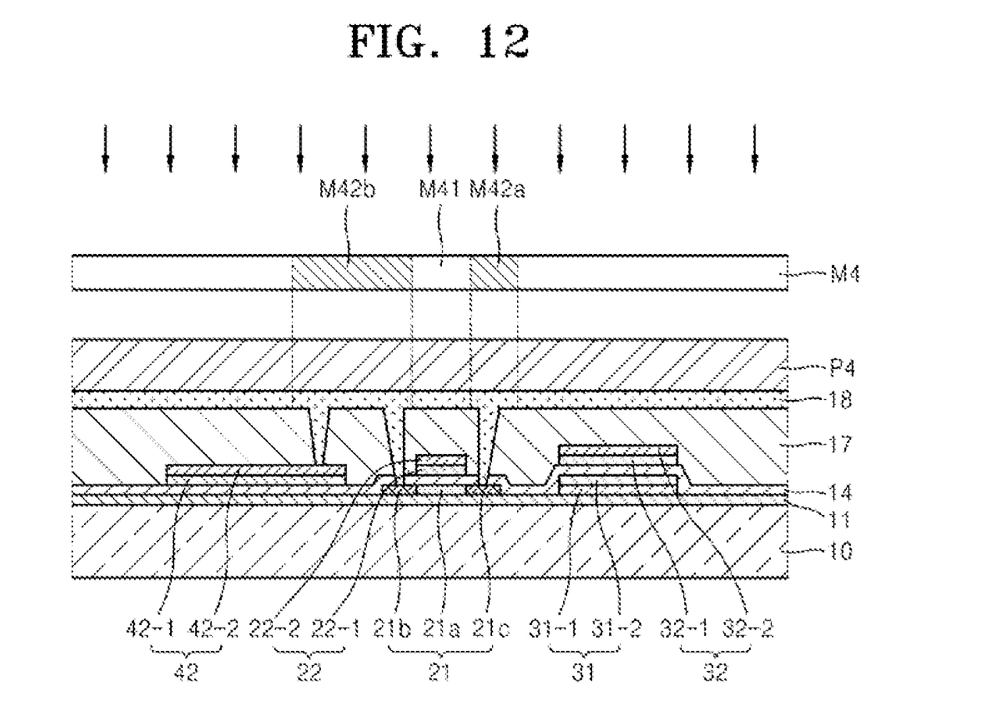
FIGS. 12 and 13 are sectional views showing a fourth masking operation of the method of manufacturing a flat panel display apparatus, according to an embodiment of the present invention.

Referring to FIG. 12, a fourth conductive layer 18 is formed on the structure of FIG. 11, which is a result of the third masking operation. A fourth photoresist layer P4 is formed on the fourth conductive layer 18, and a fourth mask M4 is aligned on the substrate 10.

Although the fourth conductive layer 18 may be formed of the material used to form the second conductive layer 15 and/or the third conductive layer 16 described above, aspects of the present invention are not limited thereto, and the fourth conductive layer 18 may be formed of various conductive materials. Furthermore, the conductive materials are deposited to a thickness sufficient to fill the openings 23a, 23b, and 23c described above.

The fourth mask M4 includes a photo-transmissive region M41 and photo-interceptive regions M42a and M42b. After a photolithographic operation is performed on the fourth photoresist layer P4 and the fourth photoresist layer P4 is developed, remaining portions of the fourth photoresist layer P4 are used as etching masks for an etching operation in a fourth masking operation.

Figure 13:
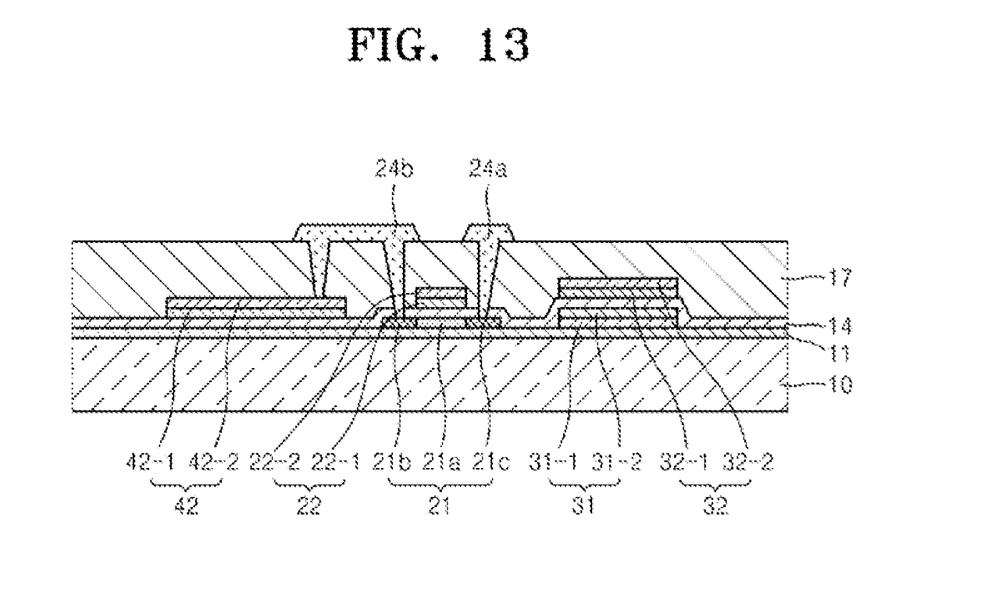

Referring to FIG. 13, as a result of the fourth masking operation, the source electrode 24a and the drain electrode 24b, which respectively contact the source region 21a and the drain region 21b via the contact holes 23a and 23b, are formed on the second insulation layer 17. Furthermore, one of the source electrode 24a and the drain electrode 24b is formed to be connected to the pixel top electrode 42-2 via the via hole 23c, wherein the via hole 23c is connected to a portion of the edge regions of the pixel top electrode 42-2.

Figure 14:
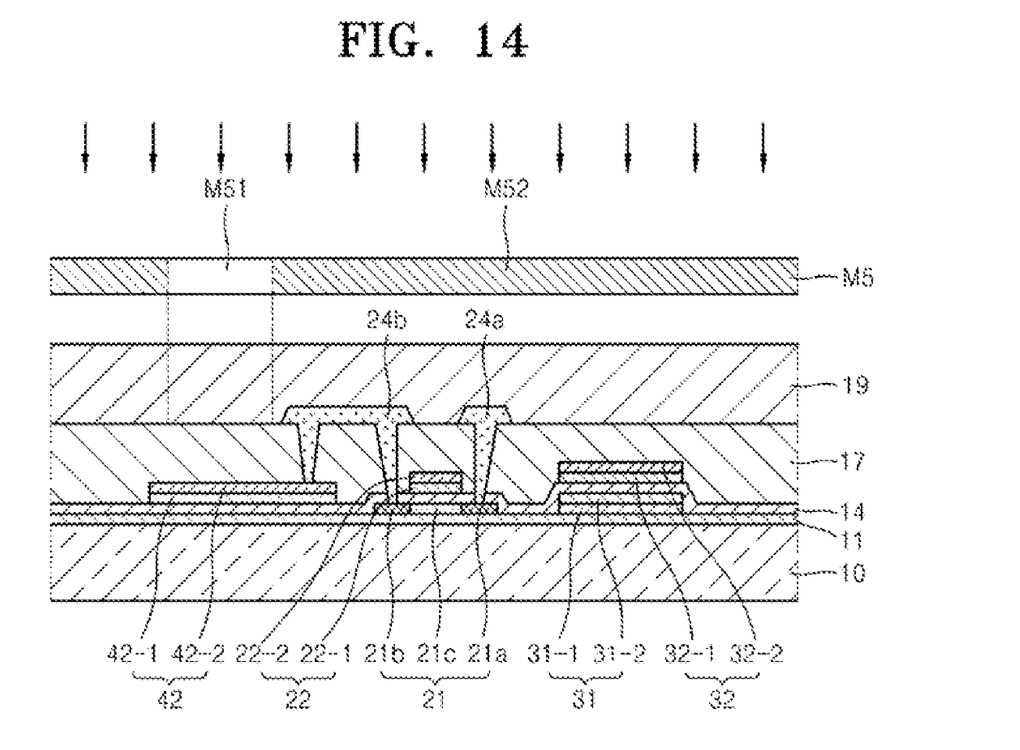
FIGS. 14 and 15 are sectional views showing a fifth masking operation of the method of manufacturing a flat panel display apparatus, according to an embodiment of the present invention.

Referring to FIG. 14, a third insulation layer 19 is formed on the structure illustrated in FIG. 13, which is a result of the fourth masking operation, and a fifth mask M5 is aligned on the substrate 10.

The third insulation layer 19 may be formed of one or more organic insulation materials, such as polyimide, polyamide, acryl resin, and phenol resin, using a method such as spin coating. Meanwhile, the third insulation layer 19 may be formed of organic insulation materials as described above, and also the inorganic insulation materials used to form the first insulation layer 14 and the second insulation layer 17 described above. The third insulation layer 19 functions as a pixel defining layer (PDL) 43 of the OLED apparatus 1 described below, after an etching operation is performed using the fifth mask M5.

The fifth mask M5 includes a photo-transmissive region M51 formed in a portion thereof corresponding to the double-layered pixel electrode 42 and a photo-interceptive region M52 formed in remaining portions thereof.

Referring to FIG. 15, after the etching operation of FIG. 14 is performed, the second insulation layer 17, the third insulation layer 19, and the pixel top electrode 42-2 in a region corresponding to the photo-transmissive region M51 are etched, and thus the pixel bottom electrode 42-1 is exposed. The second insulation layer 17 and the third insulation layer 19 are sequentially stacked on the edge of the pixel top electrode 42-2 around an opening 44 formed in the etching operation above. At this point, the third insulation layer 19, which is formed to have a predetermined thickness along the opening 44, widens an interval between the edge of the double-layered pixel electrode 42 and an opposite electrode 47 described below to prevent concentration of electric field at the edge of the pixel electrode 42. In other words, the third insulation layer 19 functions as the PDL 43 preventing a short between a pixel electrode 42 and an opposite electrode which is the two-way electrode 47.

Referring to FIG. 16, an intermediate layer 46, which includes an organic light emitting layer 45, and the two-way electrode 47 are formed on the exposed portion of the pixel bottom electrode 42-1 and the PDL 43.

The organic light emitting layer 45 emits light when electrically driven by the double-layered pixel electrode 42 and the two-way electrode 47. The organic light emitting layer 45 may be formed of either a low molecular organic material or a high molecular organic material.

If the organic light emitting layer 45 is formed of a low molecular organic material, the intermediate layer 46 may include a hole transport layer (HTL) and a hole injection layer (HIL) stacked toward the pixel electrode 42, and an electron transport layer (ETL) and an electron injection layer (EIL) stacked toward the two-way electrode 47. Furthermore, various other layers may be stacked if required. Further, various organic materials such as copper phthalocyanine (CuPc), N,N'-Di(naphthalene-1-yl)-N,N'-diphenyl-benzidine, tris-8-hydroxyquinoline aluminum (Alq3), etc., may be used as the organic light emitting layer 45.

Meanwhile, If the organic light emitting layer 45 is formed of a high molecular organic material, the intermediate layer 46 may include only the HTL formed toward the pixel electrode 42 from the organic light emitting layer 43. The HTL may be formed of poly-(2,4)-ethylene-dihydroxy thiophene (PEDOT), polyaniline (PANI), etc., and may be formed on the top surface of the pixel electrode 42 using a method such as inkjet printing or spin coating. Here, organic materials may be high molecular organic materials such as a poly-phenylenevinylene material or a polyfluorene material, and a color pattern may be formed by using a general method such as inkjet printing, spin coating, or heat transference using a laser.

The two-way electrode 47 is formed on the intermediate layer 46 including the organic light emitting layer 45, as a common electrode. In the case of the OLED apparatus 1 according to the current embodiment, the pixel electrode 42 is used as an anode electrode, whereas the two-way electrode 47 that is formed as a common electrode is used as a cathode electrode. However, aspects of the present invention are not limited thereto and the polarity of the pixel electrode 42 and the two-way electrode 47 that is formed as a common electrode may be reversed.

If the OLED apparatus 1 is a bottom emission type OLED device in which images are displayed below the substrate 10, the pixel electrode 45 becomes a transparent electrode and the two-way electrode 47 that is formed as a common electrode becomes a reflective electrode. Here, the reflective electrode may be formed by depositing a thin layer of metal with a small work function, such as Ag, Mg, Al, Pt, Pd, Au, Ni, Nd, Ir, Cr, Li, Ca, LiF/Ca, LiF/Al, or a compound thereof.

Furthermore, although not illustrated in FIG. 16, a sealant and a moisture absorbent may further be disposed on the two-way electrode 47 that is formed as a common electrode for protecting the organic light emitting layer 45 from external moisture or oxygen.

According to the OLED apparatus and the method of manufacturing the same according to the embodiment described above, an OLED apparatus can be manufactured by using a small number of masks. Therefore, manufacturing costs can be reduced and the manufacturing process can be simplified due to a reduction in the number of masks required.

Meanwhile, although an operation using a half-tone mask is employed to reduce the number of masks required, the half-tone mask is used only once, and thus a cost increase due to the use of the half-tone mask can be minimized.

Furthermore, the pixel electrode is kept protected by the second insulation layer and the third insulation layer, and is exposed right before the organic light emitting layer is formed. Thus, damage to the pixel electrode can be prevented, as compared to conventional methods of manufacturing OLED apparatuses in which manufacturing operations are performed while pixel electrodes are exposed.

Figure 17:
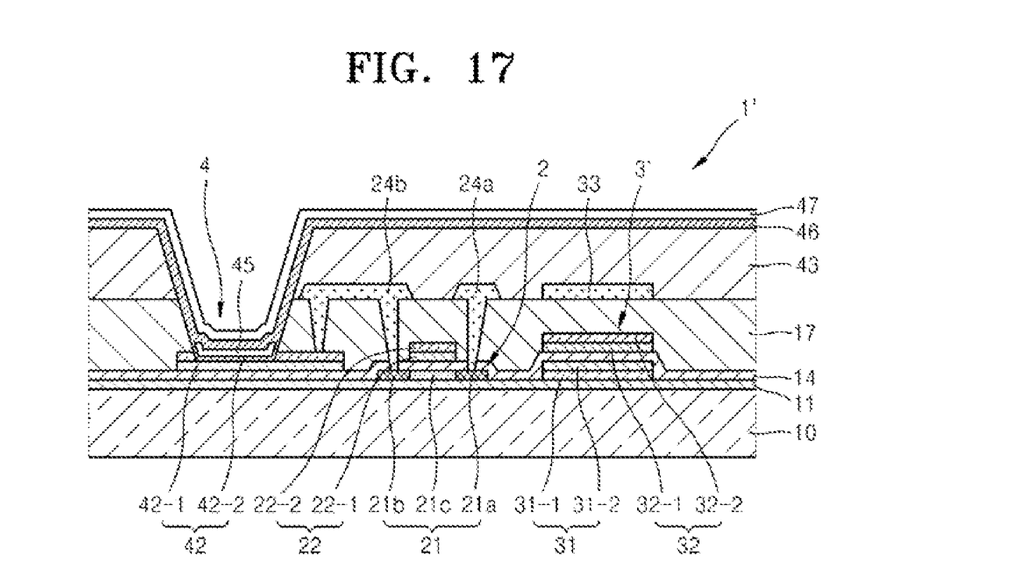
FIG. 17 is a sectional view showing a flat panel display apparatus according to a modified embodiment of the present invention.

FIG. 17 is a cross-sectional view of an OLED apparatus 1' according to another embodiment of the present invention.

The OLED apparatus 1' according to the current embodiment includes the substrate 10, the buffer layer 11, and the TFT 2 of the previous embodiment, a capacitor 3', and an OLED 4. The structure of the capacitor 3' in the OLED apparatus 1' according to the current embodiment is different from the structure of the capacitor 3 in the OLED apparatus 1. The description below will focus on this difference.

The capacitor 3' of the OLED apparatus 1', according to the current embodiment, includes a third electrode 33. The third electrode 33 of the capacitor 3' is formed on a portion of the second insulation layer 17 corresponding to the second top electrode 32-2 of the capacitor 3'. The third electrode 33 of the capacitor 3' is formed of the material used to form the source electrode and the drain electrode 24a and 24b.

In other words, although not shown in FIG. 17, a photolithographic operation is performed on the portion of the second insulation layer 17 corresponding to the second top electrode 32-2 of the capacitor 3' by using a mask pattern. The photo-interceptive region is formed in the portion of the second insulation layer 17 in the fourth masking operation to fabricate the capacitor 3' according to the current embodiment.

According to the above-described structure, the capacitance of the capacitor 3' of the OLED apparatus 1 increases, and thus the increased capacitance of the capacitor 3' contributes not only to the cost reduction due to reduction of mask usage and pixel electrode damage prevention, but also to display quality of the OLED apparatus 1'.

Hereinafter, a method of manufacturing an OLED apparatus according to another embodiment of the present invention will be described by referring to FIGS. 18 through 21. FIGS. 18 through 21 are cross-sectional views illustrating another method of manufacturing an OLED apparatus.

The OLED apparatus 1' includes the substrate 10, the buffer layer 11, the capacitor 3 and the OLED 4 of the embodiment illustrated in FIGS. 1 through 16, and a TFT 2'. The structure of the TFT 2' in the OLED apparatus 1', according to the current embodiment, is different from the structure of the TFT 2 in the OLED apparatus 1. The description below will focus on this difference.

Figure 18:
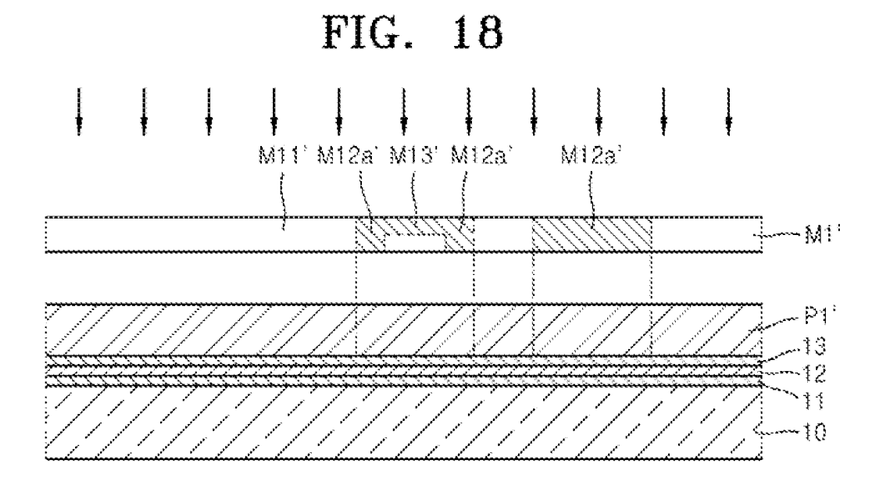
FIGS. 18 through 20 are sectional views showing a first masking operation of a method of manufacturing a flat panel display apparatus, according to another embodiment of the present invention.

First, referring to FIG. 18, a first photoresist layer P1' is formed on the structure illustrated in FIG. 1, and a first mask M1' on which a predetermined pattern is printed is aligned on the substrate 10 to pattern the first photoresist layer P1'.

The first mask M1' is a half-tone mask including a photo-transmissive region M11', photo-interceptive regions M12a', M12b', and M12c', and a semi photo-transmissive region M13'.

The first mask M1' including the pattern described above is aligned on the substrate 10, and a photolithographic operation is performed by irradiating light of wavelengths in a predetermined range on the first mask M1'.

Figure 19:
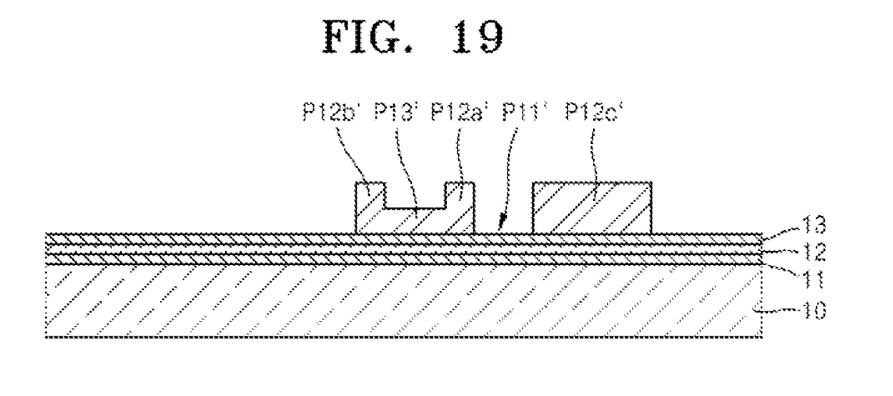

FIG. 19 shows a pattern of the first photoresist layer P1' remaining after a developing process is performed, by which exposed portions of the photoresist layer P1' are removed. A portion P11' of the first photoresist layer P1' corresponding to the photo-transmissive M11' of the first mask M1' is removed, whereas portions P12a', P12b', and P12c' of the first photoresist layer P1' respectively corresponding to the photo-interceptive regions M12a', M12b', and M12c' and a portion P13' of the first photoresist layer P1' corresponding to the semi photo-transmissive region M13' remain.

Using the portions P12a', P12b', and P12c' as masks, the semiconductor layer 12 and the first conductive layer 13 on the substrate 10 are etched by using etching equipment. In this regard, exposed portions of the semiconductor layer 12 and the first conductive layer 13 from which the first photoresist layer P1' has been removed are etched first, and the thickness of the first photoresist layer P1' is reduced by being etched. Here, the etching operation may comprise wet etching, dry etching, or the like.

Figure 20:
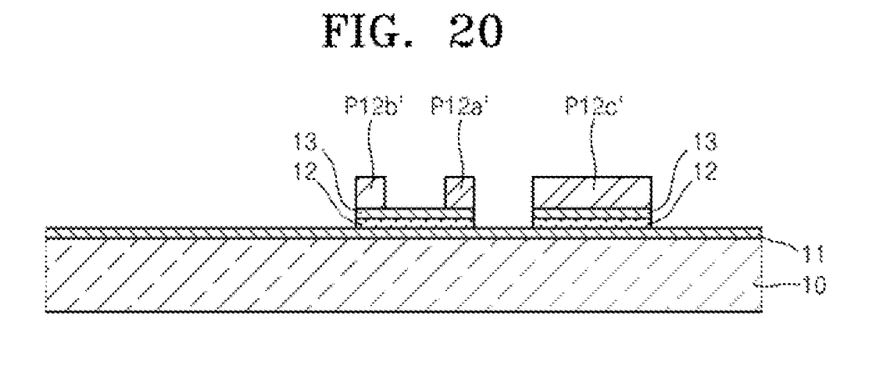

Referring to FIG. 20, while a first etching operation is being performed, portions of the semiconductor layer 12 and the first conductive layer 13, shown in FIG. 19, in the portion P11 are etched. Furthermore, referring to FIG. 20, although the portion P13' of the first photoresist layer P1' corresponding to the semi photo-transmissive region M13' is etched, structures below the portion P13' remain. Meanwhile, the portions P12a', P12b', and P12c' of the first photoresist layer P1' respectively corresponding to the photo-interceptive regions M12a, M12b, and M12c partially remain after the first etching operation, and a second etching operation is performed by using them as etching masks.

Figure 21:
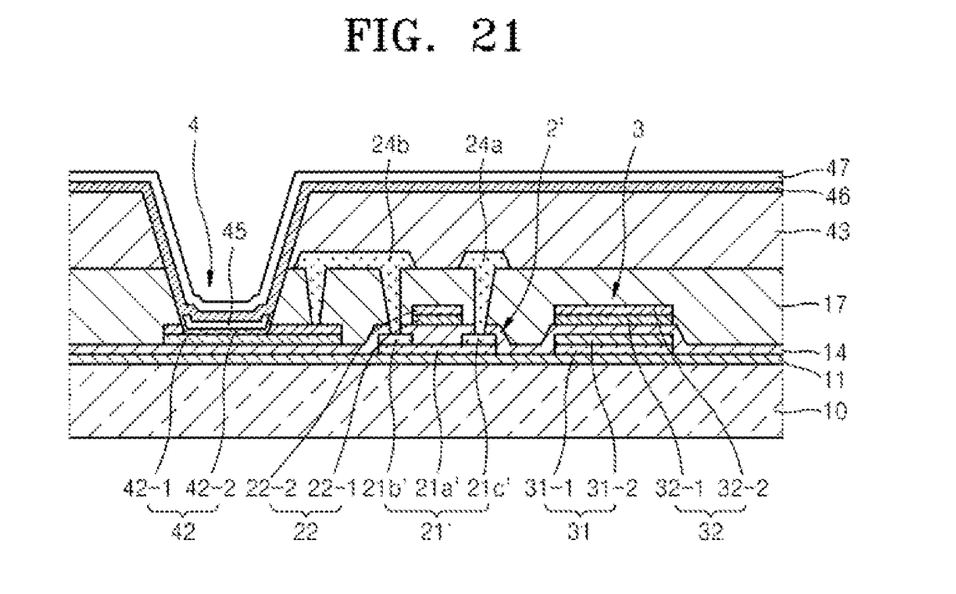
FIG. 21 is a sectional view showing a flat panel display apparatus according to another embodiment of the present invention.

FIG. 21 shows a shape of the OLED apparatus 1' after the remaining portions P12a', P12b', and P12c' illustrated in FIG. 20 are completely etched after the second etching operation and then the second through fourth masking operations are completed.

A portion of the first conductive layer 13 below a region in which the first photoresist layer P1' is partially removed (between P12a' and P12b'), is partially etched, and portions of the first conductive layer 13 below remaining regions (below P12a' and P12b') constitute the source region 21a' and the drain region 21b' of the TFT 2'.

According to the OLED apparatus 2, according to the current embodiment described above, the source region and the drain region are formed during an etching operation using the first mask M1'. In other words, a separate ion implanting operation is not necessary, unlike in the previous embodiment of the present invention, and thus the manufacturing process can be simplified.

Figure 22:
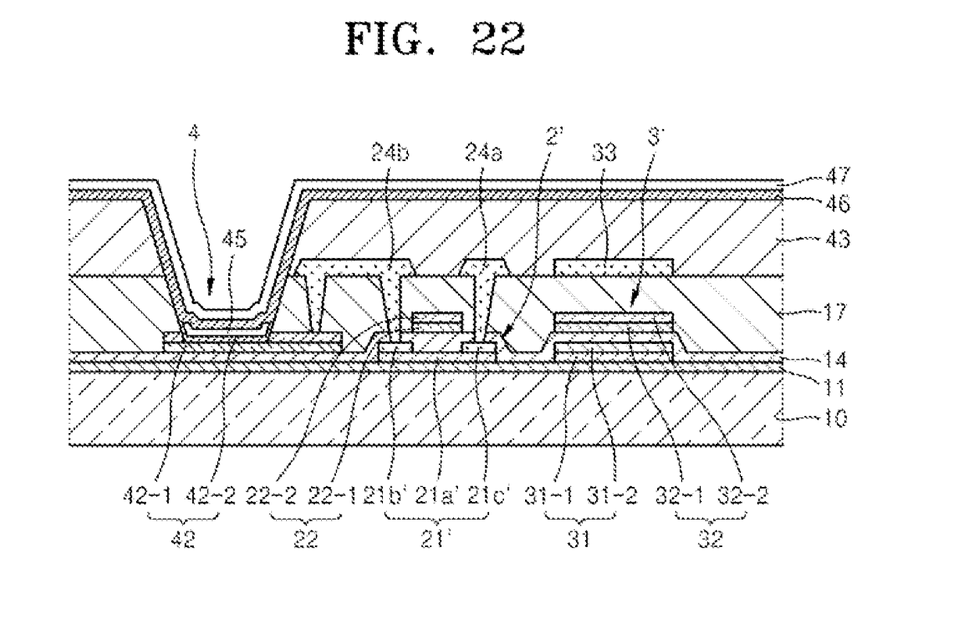
FIG. 22 is a sectional view showing a flat panel display apparatus according to another modified embodiment of the present invention.

FIG. 22 is a cross-sectional view of an OLED apparatus according to yet another embodiment of the present invention.

Referring to FIG. 22, the OLED apparatus, according to the current embodiment, includes the substrate 10, the buffer layer 11, the TFT 2', the capacitor 3', and the OLED 4. Structures of the TFT 2' and the capacitor 3' in the OLED apparatus, according to the current embodiment, are different from the structures of the TFT 2 and the capacitor 3 in the OLED apparatus 1 according to the embodiment illustrated in FIGS. 1 through 16.

As in the OLED apparatus 1', according to the previous embodiment, the TFT 2' includes the source region 21a' and the drain region 21b' that are formed of the material used to form the first top electrode 31-2 of the capacitor 3 during the first masking operation.

Meanwhile, as in the OLED apparatus 1' according to the previous embodiment, the capacitor 3' further includes the third electrode 33 of the capacitor 3' that is formed of the material used to form the source electrode 24a and the drain electrode 24b during the fourth masking operation.

According to the OLED apparatus according to the current embodiment, a separate ion implanting operation for forming the source region and the drain region is not necessary, and thus the overall manufacturing process is simplified. Furthermore, the capacitance of the capacitor 3' increases, and thus the increased capacitance of the capacitor 3' contributes to the cost reduction due to reduction of mask usage and pixel electrode damage prevention and also to display quality of the OLED apparatus.

Meanwhile, although an OLED apparatus is used as an example of a flat panel display apparatus in the embodiments described above, aspects of the present invention are not limited thereto, and various display devices such as a liquid crystal display (LCD) device, etc. can be used.

Furthermore, although one TFT and one capacitor are illustrated in FIGS. 1 through 22 for convenience of explanation, aspects of the present invention are not limited thereto. Thus, it is clear that a plurality of TFTs and a plurality of capacitors can be included.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A flat panel display apparatus comprising:
a substrate;
an active layer of a thin film transistor (TFT), comprising:
 a channel region;
 a source region; and
 a drain region,
 wherein the channel region, the source region and the drain region are formed on the same layer on the substrate;
a first bottom electrode of a capacitor formed apart from the active layer on the same layer as the active layer and formed of a same material as the active layer and a first top electrode of a capacitor formed on the first bottom electrode;
a first insulation layer formed on the substrate, the active layer, and the first top electrode;
a gate bottom electrode and a gate top electrode sequentially formed on a portion of the first insulation layer corresponding to the channel region;
a second bottom electrode and a second top electrode of the capacitor formed of the same material used to form the gate bottom electrode and the gate top electrode, wherein the second bottom electrode and the second top electrode are sequentially formed on a portion of the first insulation layer corresponding to the first top electrode of the capacitor;
a pixel bottom electrode formed of the same material used to form the gate bottom electrode and the second bottom electrode of the capacitor and formed on the first insulation layer;
a pixel top electrode formed of the same material as that used to form the gate top electrode and the second top electrode of the capacitor and formed on the edge of the top surface of the pixel bottom electrode to expose the pixel bottom electrode;
a second insulation layer formed on the gate electrode, the second electrode of the capacitor, and the pixel top electrode and penetrated by a contact hole exposing the source region and the drain region of the active layer and a via hole partially exposing the edges of the pixel top electrode; and
a source electrode and a drain electrode formed on the second insulation layer and connected to the source region, the drain region, and the pixel top electrode via the contact hole and the via hole.

2. The flat panel display apparatus of claim 1, further comprising:
a pixel defining layer formed on the second insulation layer and exposing the pixel bottom electrode;
an intermediate layer formed on the pixel bottom electrode and comprising an organic light emitting layer; and
an opposite electrode formed on the intermediate layer.

3. The flat panel display apparatus of claim 1, wherein the active layer of the TFT and the first bottom electrode of the capacitor comprise polysilicon, which is formed by crystallizing amorphous silicon.

4. The flat panel display apparatus of claim 1, wherein the first top electrode of the capacitor contains silicon into which impurities are implanted.

5. The flat panel display apparatus of claim 1, wherein shapes of ends of the first bottom electrode and the first top electrode of the capacitor are the same.

6. The flat panel display apparatus of claim 1, wherein shapes of ends of the gate bottom electrode and the gate top electrode are the same.

7. The flat panel display apparatus of claim 1, wherein shapes of ends of the second bottom electrode and the second top electrode of the capacitor are the same.

8. The flat panel display apparatus of claim 1, wherein shapes of ends of the pixel bottom electrode and the pixel top electrode are the same.

9. The flat panel display apparatus of claim 1, further comprising a buffer layer on the substrate.

10. The flat panel display apparatus of claim 1, wherein the thickness of the second insulation layer is greater than that of the first insulation layer.

11. The flat panel display apparatus of claim 1, further comprising a third electrode of the capacitor, which is formed of the same material as that used to form the source electrode and the drain electrode and is formed on the second insulation layer to correspond to the second top electrode of the capacitor.

12. A flat panel display apparatus comprising:
a substrate;
an active layer of a thin film transistor (TFT), comprising:
 a channel region formed on the substrate;
 a source region; and
 a drain region,
 wherein the channel region, the source region and the drain region are formed on the edge of the top surface of the channel region;
a first bottom electrode of a capacitor formed apart from the active layer on the same layer as the channel region and formed of a same material as the active layer;
a first top electrode of a capacitor formed on the first bottom electrode;
a first insulation layer formed on the substrate, the active layer, and the first top electrode;
a gate bottom electrode and a gate top electrode sequentially formed on a portion of the first insulation layer corresponding to the channel region;
a second bottom electrode and a second top electrode of the capacitor formed of the same material used to form the gate bottom electrode and the gate top electrode and sequentially formed on a portion of the first insulation layer corresponding to the first top electrode of the capacitor;

a pixel bottom electrode formed of the same material used to form the gate bottom electrode and the second bottom electrode of the capacitor and formed on the first insulation layer;

a pixel top electrode formed of the same material used to form the gate top electrode and the second top electrode of the capacitor and formed on the edge of the top surface of the pixel bottom electrode to expose the pixel bottom electrode;

a second insulation layer formed on the gate electrode, the second electrode of the capacitor, and the pixel top electrode and penetrated by a contact hole exposing the source region and the drain region of the active layer and a via hole partially exposing the edges of the pixel top electrode; and a source electrode and a drain electrode formed on the second insulation layer and connected to the source region, the drain region, and the pixel top electrode via the contact hole and the via hole.

13. The flat panel display apparatus of claim 12, further comprising:

a pixel defining layer formed on the second insulation layer and exposing the pixel bottom electrode;

an intermediate layer formed on the pixel bottom electrode and comprising an organic light emitting layer; and an opposite electrode formed on the intermediate layer.

14. The flat panel display apparatus of claim 1, wherein the capacitor comprises a third electrode which is formed of the same material as that used to form the source electrode and the drain electrode and is formed on the second insulation layer to correspond to the second top electrode of the capacitor.

15. A method of manufacturing a flat panel display apparatus, the method comprising:

sequentially forming a semiconductor layer and a first conductive layer on a substrate;

simultaneously patterning the semiconductor layer and the first conductive layer to form an active layer of a thin-film transistor (TFT) and a capacitor having a first bottom electrode and a first top electrode in a first masking operation;

forming a first insulation layer on a structure formed by the first mask operation;

sequentially forming a second conductive layer and a third conductive layer on the first insulation layer;

simultaneously patterning each of the second conductive layer and the third conductive layer to respectively form a gate bottom electrode and a gate top electrode of the TFT, to form a second bottom electrode and a second top electrode of the capacitor, and to form a pixel bottom electrode and a pixel top electrode in a second masking operation;

forming a source region and a drain region in edges of the active layer of the TFT by using the gate bottom electrode and the gate top electrode as a self-aligned mask;

forming a second insulation layer on a structure formed by the second masking operation;

patterning the second insulation layer to partially expose the source region and the drain region and edges of the pixel top electrode in a third masking operation;

forming a fourth conductive layer on a structure formed by the third masking operation;

patterning the fourth conductive layer to form a source electrode and a drain electrode of the TFT in a fourth masking operation;

forming a third insulation layer on a structure formed by the fourth masking operation; and removing the second insulation layer and the third insulation layer, such that the pixel top electrode is exposed, in a fifth masking operation.

16. The method of claim 15, wherein a first mask of the first masking operation is a half-tone mask comprising a semi photo-transmissive region in a portion thereof corresponding to the active layer of the TFT.

17. The method of claim 15, further comprising sequentially forming an intermediate layer comprising an organic light emitting layer and an opposite electrode on a structure formed by the fifth masking operation.

18. The method of claim 15, further comprising forming a buffer layer on the substrate.

19. The method of claim 15, wherein the fourth masking operation comprises an operation for simultaneously patterning the third electrode of the capacitor, the source electrode, and the drain electrode to form the fourth conductive layer.

20. A method of manufacturing a flat panel display apparatus, the method comprising:

forming a semiconductor layer and a first conductive layer on a substrate;

simultaneously patterning the semiconductor layer and the first conductive layer to form an active layer of a thin-film transistor (TFT) in a first masking operation, wherein the active layer comprises a channel region, a source region, and a drain region, and a capacitor having a first bottom electrode and a first top electrode;

forming a first insulation layer on a structure formed by the first mask operation;

sequentially forming a second conductive layer and a third conductive layer on the first insulation layer;

simultaneously patterning each of the second conductive layer and the third conductive layer respectively to form a gate bottom electrode and a gate top electrode of the TFT, to form a second bottom electrode and a second top electrode of the capacitor, and to form a pixel bottom electrode and a pixel top electrode in a second mask operation;

forming a second insulation layer on a structure formed by the second masking operation;

patterning the second insulation layer to partially expose the source region and the drain region and edges of the pixel top electrode in a third masking operation;

forming a fourth conductive layer on a structure formed by the third masking operation;

patterning the fourth conductive layer to form a source electrode and a drain electrode of the TFT in a fourth masking operation;

forming a third insulation layer on a structure formed by the fourth masking operation; and removing the second insulation layer and the third insulation layer such that the pixel top electrode is exposed, in a fifth masking operation.

21. The method of claim 20, wherein a first mask of the first masking operation comprises a half-tone mask comprising a semi photo-transmissive region in a portion thereof corresponding to the center region of the active layer of the TFT.

22. The method of claim 20, further comprising sequentially forming an intermediate layer comprising an organic light emitting layer and an opposite electrode on a structure formed by the fifth masking operation.

23. The method of claim 20, further comprising forming a buffer layer on the substrate.

24. The method of claim 20, wherein the fourth masking operation comprises an operation for simultaneously patterning the third electrode of the capacitor, the source electrode, and the drain electrode to form the fourth conductive layer.

25. The method of claim 16, wherein the half-tone mask is used only once.

26. The method of claim 21, wherein the half-tone mask is used only once.

* * * * *